(12) United States Patent
Walker

(10) Patent No.: US 7,091,682 B2
(45) Date of Patent: Aug. 15, 2006

(54) FREQUENCY STABILIZER CIRCUIT FOR WINDOW COVERING CONTROL CHIP CLOCK

(75) Inventor: Winston Glenn Walker, Littleton, CO (US)

(73) Assignee: Harmonic Design, Inc., Los Angeles, CA (US)

(*) Notice: Subject to any disclaimer, the term of this patent is extended or adjusted under 35 U.S.C. 154(b) by 3 days.

(21) Appl. No.: 10/973,515

(22) Filed: Oct. 26, 2004

(65) Prior Publication Data

US 2006/0087271 A1   Apr. 27, 2006

(51) Int. Cl.
*E06B 9/32* (2006.01)
*E06B 9/36* (2006.01)

(52) U.S. Cl. ............... 318/280; 318/282; 318/16; 318/17; 160/168.1 P; 160/176.1 P

(58) Field of Classification Search ............... None
See application file for complete search history.

(56) References Cited

U.S. PATENT DOCUMENTS

| | | | |
|---|---|---|---|
| 5,038,087 A * | 8/1991 | Archer et al. ............... 318/469 |
| 5,372,173 A * | 12/1994 | Horner ............... 160/98 |
| 5,694,090 A * | 12/1997 | Morgan ............... 331/57 |
| 6,094,104 A * | 7/2000 | Morgan ............... 331/57 |
| 6,175,280 B1 * | 1/2001 | Lloyd et al. ............... 331/1 R |
| 6,186,211 B1 * | 2/2001 | Knowles ............... 160/84.02 |
| 6,283,190 B1 * | 9/2001 | Hu et al. ............... 160/84.02 |
| 6,369,530 B1 * | 4/2002 | Kovach et al. ............... 318/16 |
| 6,373,341 B1 * | 4/2002 | Morgan ............... 331/57 |
| 6,736,184 B1 * | 5/2004 | Eaton ............... 160/84.02 |
| 6,812,662 B1 * | 11/2004 | Walker ............... 318/280 |
| 2001/0011580 A1 * | 8/2001 | Knowles ............... 160/84.02 |
| 2003/0015301 A1 * | 1/2003 | Killo et al. ............... 160/310 |
| 2003/0196765 A1 * | 10/2003 | Ciuca et al. ............... 160/170 |
| 2005/0217805 A1 * | 10/2005 | Strand et al. ............... 160/168.1 P |

FOREIGN PATENT DOCUMENTS

EP          921266 A2 *  6/1999
JP        11056594 A  *  3/1999

* cited by examiner

*Primary Examiner*—Marlon T. Fletcher
*Assistant Examiner*—Eduardo Colon Santana
(74) *Attorney, Agent, or Firm*—John L. Rogitz

(57) ABSTRACT

A logic chip that controls the motor of a motorized window covering or other object includes a clock. A frequency stabilizer circuit is provided to receive input voltage and to output to the clock a current that is a function of the voltage and temperature over a range of input voltage values and over a range of ambient temperature values so that the frequency output by the oscillator is constant.

14 Claims, 1 Drawing Sheet

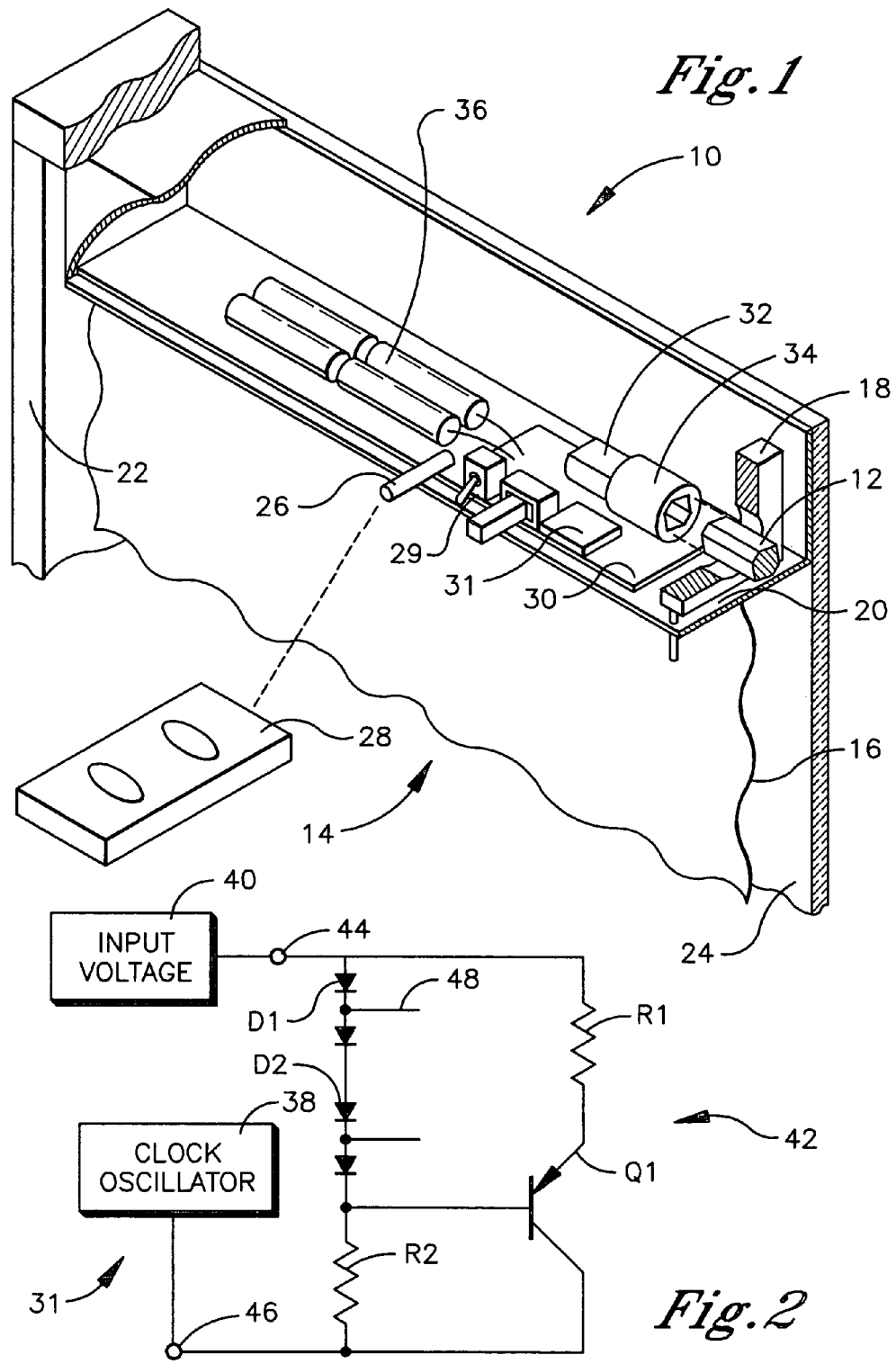

FREQUENCY STABILIZER CIRCUIT FOR WINDOW COVERING CONTROL CHIP CLOCK

FIELD OF THE INVENTION

The present invention relates generally to motorized window coverings, awnings, security screens, projection screens, skylight coverings, and the like.

BACKGROUND OF THE INVENTION

The present assignee has provided several systems for either lowering or raising a window or skylight covering, or for moving the slats of a window covering between open and closed positions, under control of a hand-held remote or other control device. These systems include a motor that is coupled through gears to the activation mechanism. When the motor is energized in response to a user command signal, the activation mechanism moves the window covering. Such assemblies are disclosed in U.S. Pat. No. 6,433,498, incorporated herein by reference.

In the above-referenced patent, control logic for the motor is disclosed that may be implemented in an integrated circuit chip. As recognized herein, such chips typically include a clock that produces the clocking signals necessary for chip operation. As further recognized herein, the clock might be implemented by an oscillator, with the clocking signal that is produced by the oscillator potentially varying undesirably as it might owing to changes in current to the oscillator, temperature of the circuit and/or supply voltage. Having made this critical observation, the invention herein is provided.

SUMMARY OF THE INVENTION

A powered assembly includes an object that can be moved between a raised configuration and a lowered configuration. The assembly also includes a motor, and an actuator coupled to the motor and the object to move the object when the motor is energized. A logic chip controls the motor. The logic chip includes a clock that generates clocking signals. In accordance with the present invention, a frequency stabilizer circuit receives input voltage and outputs current to the clock. The frequency stabilizer circuit outputs a current over a range of input voltage values and over a range of ambient temperature values such that the current is an appropriate function of voltage and temperature to maintain a substantially constant frequency from the oscillator.

If desired, the frequency stabilizer circuit may include a constant current portion and a constant resistance portion. The constant current portion may include plural diodes and the constant resistance portion may include a resistor. The clock can be established at least in part by an oscillator.

In another aspect, a drive assembly for a movable object includes an electrically powered drive structure configured to move the object when the drive structure is energized, and a logic circuit electrically coupled to the drive structure to control the drive structure. The logic circuit includes an internal clock. A frequency stabilizer circuit provides a current to the clock over a range of input voltage values and/or a range of ambient temperature values that is a function of voltage and temperature.

In still another aspect, a power assembly for an object having at least one operator includes power means, motor means energized by the power means, and logic means selectively energizing the motor means. Clock means are in the logic means for providing a clocking signal. Means are provided for outputting, to the clock means, a current input over a range of input voltage values and over a range of ambient temperature values that is an appropriate function of voltage and temperature to maintain a substantially constant frequency from the oscillator.

The details of the present invention, both as to its construction and operation, can best be understood in reference to the accompanying drawings, in which like numerals refer to like parts, and which:

BRIEF DESCRIPTION OF THE DRAWINGS

FIG. 1 is a perspective view of a window covering actuator, shown in one intended environment, with portions of the head rail cut away; and FIG. 2 is a schematic diagram of an exemplary non-limiting frequency stabilizer circuit.

DETAILED DESCRIPTION OF THE PREFERRED EMBODIMENT

Referring initially to FIG. 1, a motorized window covering is shown, generally designated 10, that includes an actuator Such as a rotatable rod 12 of a window covering 14, such as but not limited to a shade assembly having raisable (by rolling up) and lowerable (by rolling down, or unrolling) shade 16. As shown, the tilt rod 12 may be rotatably mounted by means of a block 18 in a head rail 20 of the window covering 14.

While a roll-up shade is shown, it is to be understood that the principles herein apply to a wide range of window coverings and other objects that are to be moved by motors. For example, the invention applies to raisable and lowerable pleated shades and cellular shades such as those commonly marketed under the trade names "Silhouette", "Shangri-La", etc. as well as to projector screens, awnings, etc. that can be raised and lowered. Moreover, the invention applies to applications that require only tilting slats such as in horizontal blinds. Thus, for example, the rod 12 may be a roll-up rod or tube of a shade, awning, or projector screen, or a tilt rod of a horizontal (or vertical) blind, or other like operator. It is thus to be further understood that the principles of the present invention apply to a wide range of window coverings and other objects including, but not limited to the following: vertical blinds, fold-up pleated shades, roll-up shades, cellular shades, skylight covers, etc. Powered versions of such shades are disclosed in U.S. Pat. No. 6,433, 498, incorporated herein by reference.

In the non-limiting illustrative embodiment shown, the window covering 14 is mounted on a window frame 22 to cover a window 24, and the rod 12 is rotatable about its longitudinal axis. The rod 12 can engage a user-manipulable baton (not shown). When the rod 12 is rotated about its longitudinal axis, the shade 16 raises or lowers between an open configuration and a closed configuration.

FIG. 1 shows that the actuator 10 can include a control signal generator, preferably a signal sensor 26, for receiving a user command signal. Preferably, the user command signal is generated by a hand-held user command signal generator 28, which can be an infrared (IR) remote-control unit or a radio frequency (RF) remote-control unit. Or, the user command signal may be generated by any other means of communication well known in the art, such as by manipulable manual switches 29. The user command signals can include open, close, raise, lower, and so on.

An electronic circuit board 30 can be positioned in the head rail 20 and can be fastened to the head rail 20, e.g., by screws (not shown) or other well-known method. The preferred electronic circuit board 30 may include a logic chip 31 for processing the control signals and implementing logic such as is disclosed in the above-referenced patent.

FIG. 1 shows that a small, lightweight electric motor 32 can be coupled to a gear enclosure 34, preferably by bolting the motor 32 to the gear enclosure 34. The gear enclosure 34 is keyed to the rod 12, so that as the gears in the gear enclosure 34 turn, the rod 12 rotates.

It is to be understood that the motor 32 is electrically connected to the circuit board 30, and may be controlled in accordance with the logic embodied by the chip 31. To power the motor 32, one or more (four shown in FIG. 1) primary dc batteries 36, such as type AA alkaline batteries or Lithium batteries, can be mounted in the head rail 20 and connected to the circuit board 30. Preferably, the batteries 36 are the sole source of power for the motor, although the present invention can also be applied to powered shades and other objects that are energized from the public ac power grid.

As set forth in the above-referenced U.S. patent, a user can manipulate the signal generator 28 to generate a signal that is sensed by the signal sensor 26 and sent to the chip 31. In turn, the electrical path between the batteries 34 and the motor 32 is closed in accordance with logic in the chip 31 to energize the motor 32 and move the window covering in accordance with the signal generated by the signal generator 28.

Now referring to a non-limiting illustrative embodiment of the frequency stabilizer circuit, as shown in FIG. 2 the chip 31 can include a clock 38 for producing clocking signals that are necessary for proper chip logic execution in accordance with logic circuit operational principles known in the art. The clock 38 may be implemented by an oscillator. An input voltage 40 is also included, it being understood that the input voltage 40 may be supplied from the batteries 36 shown in FIG. 1.

As shown, a frequency stabilizer circuit 42 is interposed between the input voltage 40 and clock 38 for receiving the input voltage and outputting a current to the clock 38 that is an appropriate function of the input voltage and ambient temperature to maintain a substantially constant frequency from the oscillator. The input voltage 40 may be connected to the stabilizer circuit 42 at an input terminal 44, while the clock 38 may be connected to the stabilizer circuit 42 at an output terminal 46.

The exemplary stabilizer circuit 42 may include a constant current portion and a constant resistance portion. In the illustrative embodiment shown, two pairs D1, D2 of diodes, resistor R1 and transistor Q1 establish the constant current portion, while a resistor R2 connected to the output terminal 46 and to the base of a transistor Q1 establishes a constant resistance portion. The pairs D1, D2 of diodes are connected to the input terminal 44 and to the base of the transistor Q1. Values of the resistors and diodes (which may number more than four diodes or less than four diodes) are selected as appropriate to achieve a voltage and temperature dependent current over an expected range of operating voltage values and ambient temperature values. Non-limiting exemplary values for the exemplary non-limiting components shown above are: R1=60.4 KOhms, R2=698 KOhms, each diode pair is a type BAV99 pair, and the transistor Q1 is a type MMBT3906 transistor. If desired, respective taps 48 may be provided between the diodes of a pair, to permit selection of an odd number of diodes.

The frequency stabilizer circuit 42 may be part of the integrated circuit that is implemented in the chip 31, or it may be external to the chip.

While the particular FREQUENCY STABILIZER CIRCUIT FOR WINDOW COVERING CONTROL CHIP CLOCK as herein shown and described in detail is fully capable of attaining the above-described aspects of the invention, it is to be understood that it is the presently preferred embodiment of the present invention and thus, is representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." Moreover, it is not necessary for a device or method to address each and every problem sought to be solved by the present invention, for it is to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. section 112, sixth paragraph, unless the element is expressly recited using the phrase "means for."

What is claimed is:

1. A powered assembly, comprising:
    at least one object that can be moved between a first configuration and a second configuration, the object being selected from the group consisting of window coverings, awnings, skylight coverings, projector screens, curtains, and screens;
    at least one motor;
    at least one actuator coupled to the motor and the object to move the object when the motor is energized;
    at least one logic chip controlling the motor, the logic chip including at least one clock generating clocking signals; and
    at least one frequency stabilizer circuit receiving input voltage and outputting current to the clock, the frequency stabilizer circuit outputting a current that is a function of the voltage and temperature to produce an oscillator frequency that is substantially constant over a range of input voltage values and over a range of ambient temperature values, wherein the frequency stabilizer circuit includes a constant current portion; comprising plural diodes and a constant resistance portion comprising at least one resistor.

2. The powered assembly of claim 1, wherein the motor is powered by at least one dc battery.

3. The powered assembly of claim 2, wherein the object is a window covering.

4. The powered assembly of claim 1, wherein the clock is established at least in part by an oscillator.

5. The powered assembly of claim 1, wherein the frequency stabilizer circuit is part of an integrated circuit implemented in the chip.

6. The powered assembly of claim 1, wherein the frequency stabilizer circuit is external to the chip.

7. A drive assembly for a movable object comprising:
    an electrically-powered drive structure configured to move the object when the drive structure is energized;

a logic circuit electrically coupled to the drive structure to control the drive structure, the logic circuit including at least one internal clock; and a frequency stabilizer circuit providing current to the clock that is a function of the voltage and/or temperature over at least one of: a range of input voltage values, and a range of ambient temperature values, wherein the frequency stabilizer circuit includes at least one transistor defining a base, at least one diode and at least a first resistor connected to the base and being in series with each other, and at least a second resistor connected to a portion of the transistor other than the base.

8. The drive assembly of claim 7, wherein the frequency stabilizer circuit provides current to the clock that is a function of voltage and temperature to produce an oscillator frequency that is substantially constant over a range of input voltage values, and a range of ambient temperature values, than it would otherwise be without the frequency stabilizer circuit being interposed between the input voltage and the clock.

9. The drive assembly of claim 8, wherein the drive structure is powered by at least one dc battery.

10. The drive assembly of claim 9, wherein the object is a window covering.

11. The drive assembly of claim 8, wherein the clock is established at least in part by an oscillator.

12. The drive assembly of claim 8, wherein the frequency stabilizer circuit is part of an integrated circuit implemented in a chip implementing the logic circuit.

13. The drive assembly of claim 8, wherein the frequency stabilizer circuit is external to a chip implementing the logic circuit.

14. A power assembly for an object having at least one operator, comprising:

power means;

motor means energized by the power means for moving the operator;

logic means selectively energizing the motor means;

clock means in the logic means for providing a clocking signal; and means for outputting, to the clock means, an output that is a function of the voltage and temperature such that a substantially constant output is produced by the clock means over a range of input voltage values and over a range of ambient temperature values wherein the means for outputting includes at least one transistor defining a base, at least one diode and at least a first resistor connected to the base and being in series with each other, and at least a second resistor connected to a portion of the transistor other than the base.

* * * * *